United States Patent
Ivanov et al.

(10) Patent No.: US 6,725,522 B1
(45) Date of Patent: Apr. 27, 2004

(54) METHOD OF ASSEMBLING TARGET AND BACKING PLATES

(75) Inventors: Eugene Y. Ivanov, Grove City, OH (US); Harry W. Conard, Orient, OH (US)

(73) Assignee: Tosoh SMD, Inc., Grove City, OH (US)

(*) Notice: Subject to any disclaimer, the term of this patent is extended or adjusted under 35 U.S.C. 154(b) by 0 days.

(21) Appl. No.: 10/030,996

(22) PCT Filed: Jul. 12, 2000

(86) PCT No.: PCT/US00/18968
§ 371 (c)(1),
(2), (4) Date: Jan. 9, 2002

(87) PCT Pub. No.: WO01/03879
PCT Pub. Date: Jan. 18, 2001

(51) Int. Cl.[7] ................ B23P 11/00; B21D 39/00
(52) U.S. Cl. .......... 29/525; 29/525.14; 204/298.12; 204/298.13; 228/165; 219/121.12
(58) Field of Search ............... 29/525, 525.14; 219/121.12, 121.13; 228/165, 170, 171; 204/298.12, 298.13

(56) References Cited

U.S. PATENT DOCUMENTS

| 5,009,765 A | 4/1991 | Qamar et al. |
| 5,143,590 A | 9/1992 | Strothers et al. |
| 5,269,899 A | 12/1993 | Fan |
| 5,693,203 A * | 12/1997 | Ohhashi et al. ........ 204/298.12 |
| 5,836,506 A | 11/1998 | Hunt et al. |
| 6,071,389 A * | 6/2000 | Zhang ................ 204/298.12 |
| 6,113,761 A * | 9/2000 | Kardokus et al. ...... 204/298.13 |
| 6,521,108 B1 * | 2/2003 | Zhang ................ 204/298.13 |

FOREIGN PATENT DOCUMENTS

JP   52036373   3/1977

OTHER PUBLICATIONS

U.S patent application Ser. No. 60/129,559, Ivanov et al., filed Apr. 16, 1999.
U.S patent application Ser. No. 60/099,981, Ivanov et al., filed Sep. 11, 1998.

* cited by examiner

*Primary Examiner*—David P. Bryant
*Assistant Examiner*—Jermie E. Cozart
(74) *Attorney, Agent, or Firm*—Wegman Hessler & Vanderburg

(57) ABSTRACT

A low temperature target and backing plate bonding process and assemblies made thereby. A plurality of male projections (8) are formed in one member (2) of the assembly with a plurality of corresponding female recesses (9) formed in the other member (4). The assembly is bonded by conventional techniques around the peripheral boundary (25) that surrounds the male and female portions (8,9). The assembly is then pressure consolidated at low temperature so that the projections (8), circumscribed by the bonded zone, are force fit into the female recesses (9).

18 Claims, 4 Drawing Sheets

METHOD OF ASSEMBLING TARGET AND BACKING PLATES

CROSS-REFERENCE TO RELATED APPLICATIONS

Priority filing benefit of (1) International PCT application PCT/US00/18968 filed Jul. 12, 2000, and published under PCT 21(2) in the English language and (2) U.S. provisional application Ser. No. 60/143,314 filed Jul. 12, 1999.

BACKGROUND OF THE INVENTION

The present application pertains to a low temperature sputter target/backing plate joining technique and to assemblies made thereby.

In my U.S. provisional patent applications No. 60/099,981, filed Sep. 11, 1998 and No. 60/129,559, filed Apr. 16, 1999, a target and backing plate are provided wherein the harder material of the two is machined or otherwise formed so as to have a plurality of ridges or other salient surface portions thereof. These ridges or salient portions are formed along the interior surface of the target or backing plate. The ridged surface is then placed alongside the mating surface of the other member of the assembly along the target/backing plate interface wherein joining will occur.

The peripheral portion of the interfacial surface assembly, surrounding the ridges or salient portions, is joined by conventional means such as electron beam welding, TIG welding, friction welding, soldering, brazing, etc., preferably under vacuum. The assembly is then pressed at a low temperature, preferably at room temperature.

The projections or ridges formed along either the target or backing plate bend upon penetration into the mating metal surface along the target/backing plate interface and form an interlocking grip over the softer metal on the opposing mating surface.

SUMMARY OF THE INVENTION

In this invention, a target and backing plate are provided wherein both materials are similar in mechanical properties and both are machined or otherwise formed so as to have a plurality of ridges and grooves or other salient surface portions thereof. These ridges or salient portion are formed along the interior surface of the target or backing plate. The ridged surface is then placed alongside the mating surface (having appropriately positioned mating members) of the other member of the assembly along the target/backing plate interface wherein joining will occur.

The peripheral portion of the interfacial surface assembly is joined by conventional means such as electron beam welding, TIG welding, friction welding, soldering, brazing, etc., preferably under vacuum. The assembly is then pressed at a low temperature, preferably at room temperature.

The projections or ridges formed along either the target or backing plate penetrate into the mating members along the target/backing plate interface. The projections penetrate into the grooves on the opposing mating surface.

The projections and grooves have different sizes so that after penetration, a force or friction fit joint will be formed.

Other objects and advantages of the invention will be apparent from the following description, the accompanying drawings and the appended claims.

DETAILED DESCRIPTION OF THE PREFERRED EMBODIMENT

Figure 1:
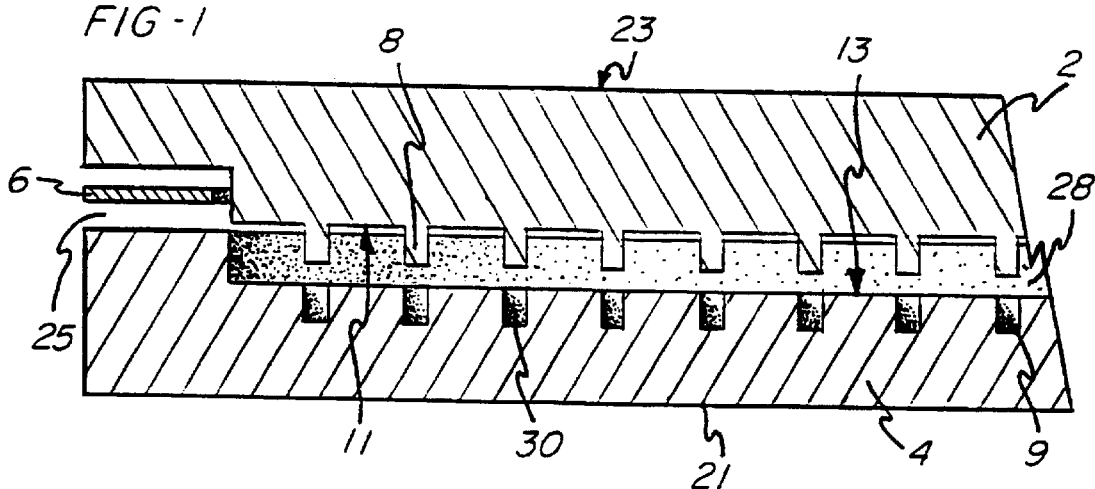
FIG. 1 is a schematic cross sectional view of a target and backing plate assembly showing the friction fit joining mechanisms in the form of cylindrical male projections ready for insertion into cylindrical bores.

Turning first to FIG. 1 there is shown a target/backing plate assembly. The assembly comprises a target 2 having a top side 23 carrying metal or metal alloy that, in accordance with conventional sputtering methods, will be ejected from the target via ionic bombardment and will travel to and coat the desired substrate.

A backing plate 4 is provided under the target, with the bottom side 11 of the target adapted to mate with the top side 13 of the backing plate to define an interfacial surface area 28. Commonly, a heat exchange fluid such as water is circulated adjacent the bottom side 21 of the backing plate so as to cool the assembly during its sputtering operation.

As shown in the FIG. 1 embodiment a plurality of cylindrical male projections 8 are machined into the surface 11. The surface 13 is provided with cylindrical female bore members 9 of smaller diameter than the diameter of the male projections 8.

In some cases, it is desired to provide a filler material 6, such as an Al 4%Si alloy or other suitable alloy, in the form of a ring or the like, adjacent the peripheral border 25 of the assembly between the target and backing plate. The filler material 6 enhances bonding of the target to the backing plate as shall be explained hereinafter.

The assembly is first bonded around the peripheral border 25. This initial bonding along the peripheral border of the assembly may be achieved by conventional means such as by E-beam welding under vacuum conditions, TIG welding, and friction welding and the like. Preferably, the bonding of the peripheral boundaries of the target and backing plate is performed via E-beam welding under vacuum conditions.

After the peripheral bonding, the assembly is consolidated, via pressure application thereto, at pressure of about 50 tons–5,000 tons; preferably less than about 1,000 tons, under low temperature conditions. The male members 8 are friction fit into the corresponding female bores 9.

After the low temperature pressure consolidation, the assembly may be subjected to a low temperature annealing step conducted at temperatures of about room to 400° C. for a period of 0.5 to 4 hours. This will help ensure adequate adhesion of the pressure consolidated surfaces.

The phrase "low temperature pressure consolidation" refers to pressure consolidation that may occur at temperatures of less than about 50% of the melting temperature of the lower melting member of the target and backing plate. Preferably, this temperature is less than about 200° C.; most preferably at about room temperature up to about 38° C.

Figure 2:
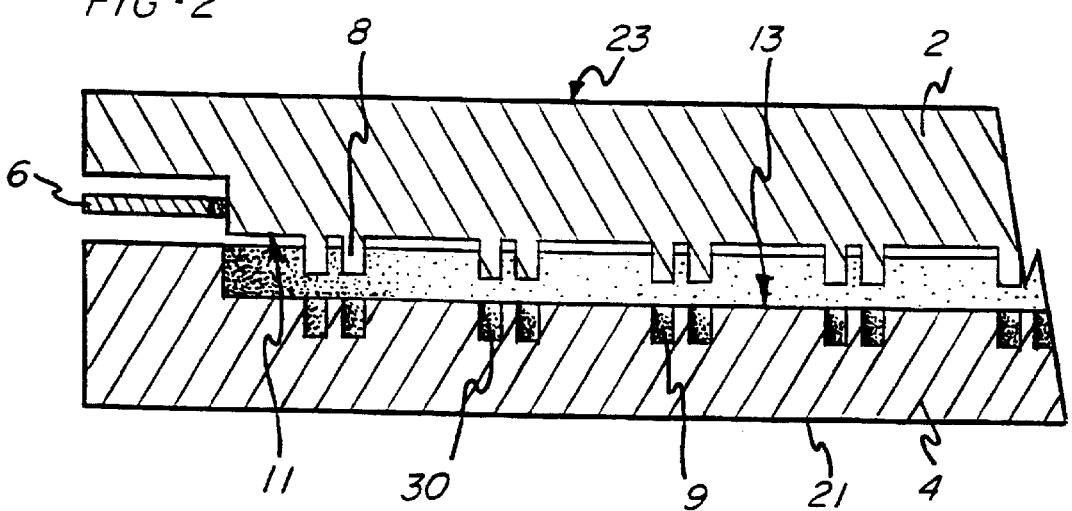
FIG. 2 is a schematic cross section showing another embodiment of the joining members having square male projections in one member and correspondingly square shaped recesses formed in the other member.

Turning now to FIG. 2, there is shown another embodiment of the invention wherein the target and backing plate may be joined by low temperature pressure consolidation. Here, the male projections 8 are in the form of elongated square cross sectioned members that are force fit into square recesses 9 formed in the backing plate 4.

Figure 3:
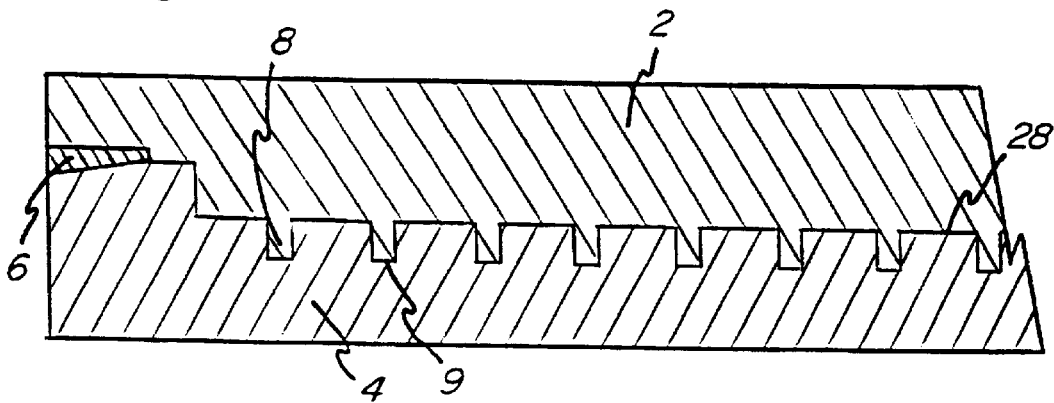
FIG. 3 is a schematic cross sectional view of the assembly shown in FIG. 1 in the mating or joined position.
Figure 4:
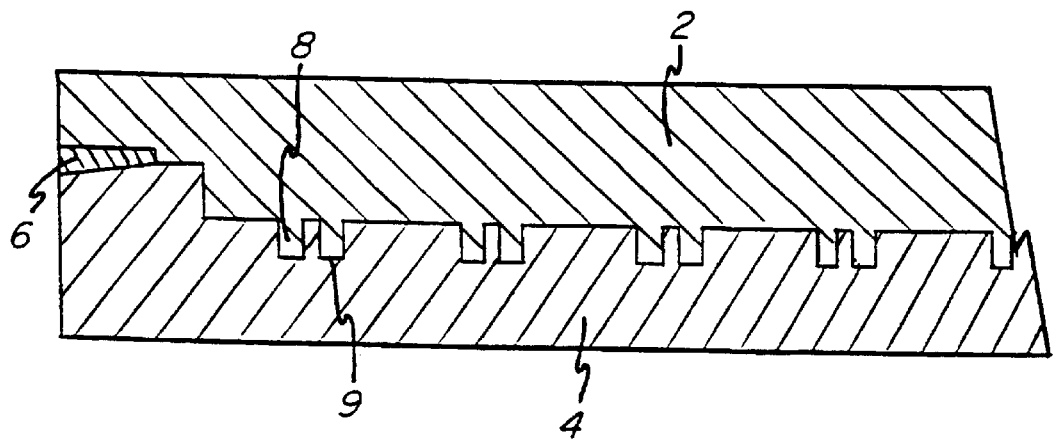
FIG. 4 is a schematic cross sectional view of the assembly shown in FIG. 2 in the mating or joined position.

FIGS. 3 and 4 show the assemblies of FIGS. 1 and 2 respectively in their mated positions in which, by reason of the low temperature pressure consolidation, the projecting male members are frictionally free fit in their mating, female recesses and in which the target and backing plate are bondingly joined.

Figure 5:
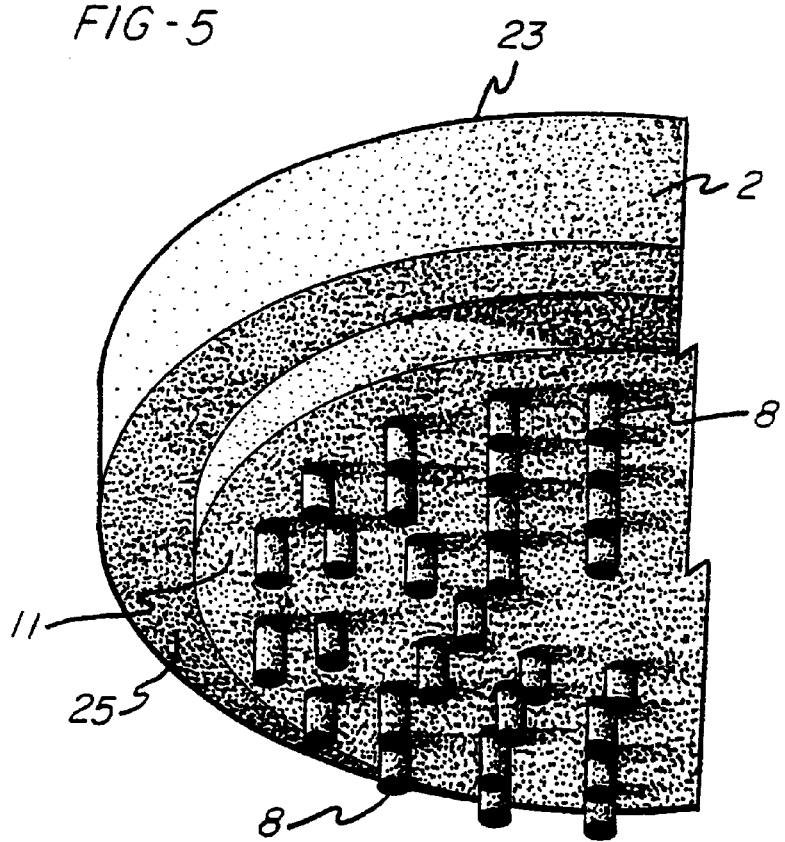
FIG. 5 is a partially exploded perspective view of the assembly of FIG. 1 before bonding.
Figure 5:
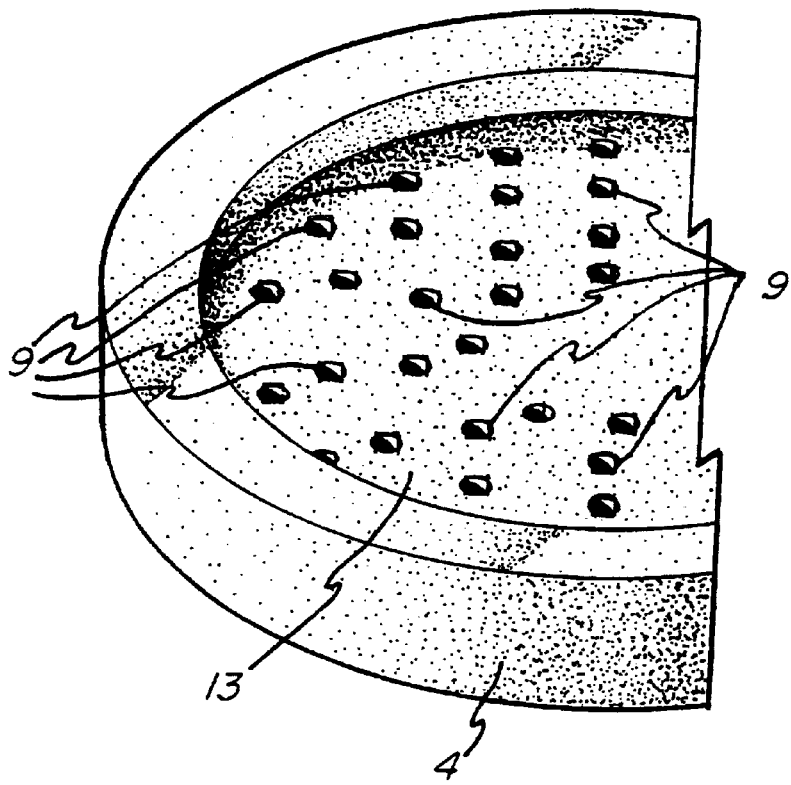

FIG. 5 shows, in perspective, the male and female coupling members of the FIG. 1 embodiment. Male members 8 are in the form of a cylindrical dowel-like projection adapted for mating with the cylindrical bores 9. The bores 9 have a smaller id than the od of the projecting male members 8. As shown, the male members 8 and the bores 9 are arranged in a pattern of concentrically arranged annular rows.

Figure 6:
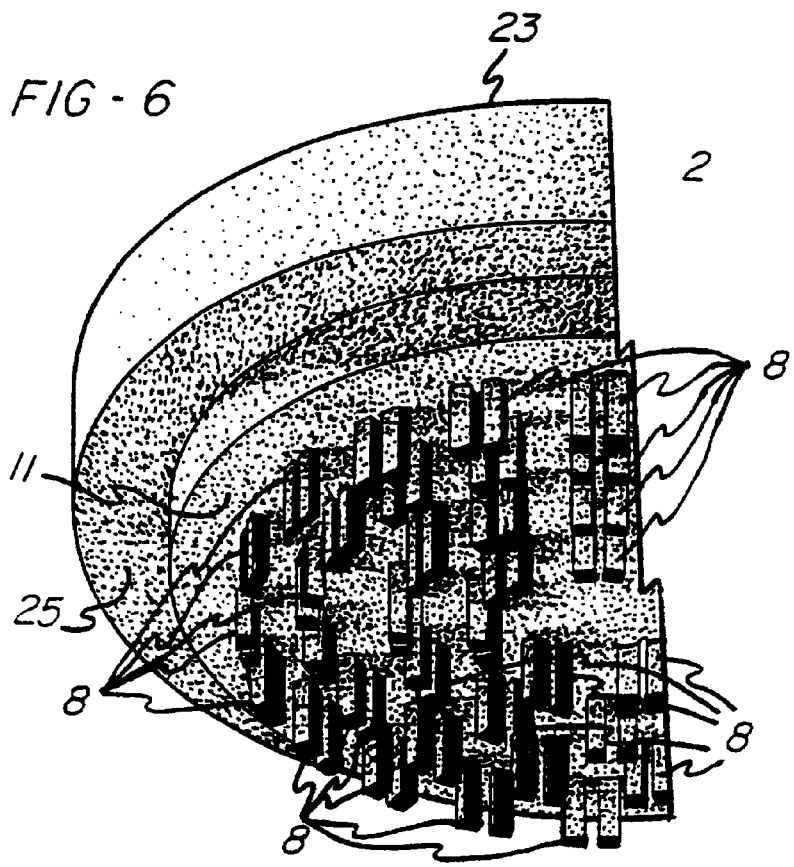
FIG. 6 is a partially exploded perspective view of the assembly of FIG. 2 before bonding.
Figure 6:
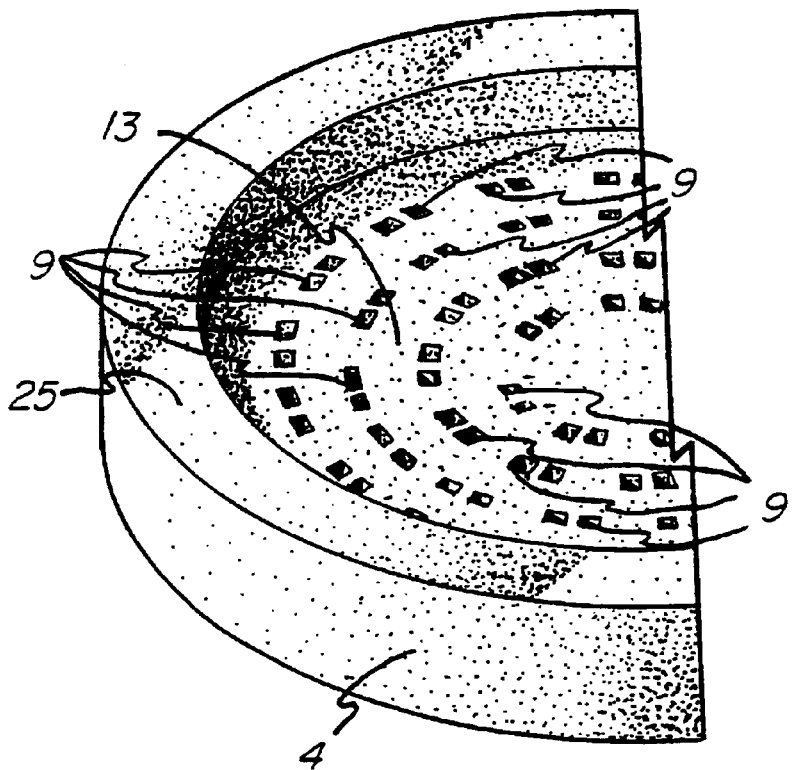

FIG. 6 depicts the male/female mating members shown in the FIG. 2 embodiment. Here, the male members 8 are in the form of elongated square cross-sectioned studs adapted for reception into the smaller openings 9.

In one target/backing plate assembly bonding in accordance with the invention, rectangular cross-sectioned male projections were used and frictionally fit into corresponding rectangular female openings. The target and backing plate were both copper and the female openings were about 0.010" smaller than the male members. The male and female members were machined into the respective surfaces. The target/backing plate assembly was pressed so that the male and female coupling members were friction fit. After pressing, the peripheral portion of the assembly was welded via electron beam. After the welding step, a final machining operation was performed so that the welded area was not removed.

The locking joint of the invention can therefore be described as a friction fit joint formed between a projecting male member disposed on one member and a corresponding female opening formed in the other member.

While the methods described herein, and the target/backing plate assemblies produced in accordance with the methods, have been described with certain specific forms and certain modifications thereof, it will be appreciated that a wide variety of other modifications can be made without departing from the scope and spirit of this invention as defined in the appended claims. It is also to be kept in mind that reference to a metal or metal component herein also includes reference to alloyed forms of the stated metal.

Although copper to copper bonding is specifically mentioned, other metals can benefit from the invention. For example, Al target to Al backing plates may be joined using the methods herein disclosed. Other target to backing plate combinations are possible provide the mechanical characteristics of the metals such as hardness and thermal expansion, are similar.

The present invention provides advantage over diffusion bonding and other joining techniques that require higher temperatures in the consolidation. Higher temperature conditions sometimes result in undesirable grain growth in the target metal.

What is claimed is:

1. In a method of preparing a bonded sputter target/backing plate assembly comprising a target composed of a metal or alloy to be sputtered and an underlying metallic backing plate member, an improved method for joining said target and backing plate along mating surfaces thereof, comprising:

a) forming a plurality of projecting male portions in at least one of said mating surfaces and a plurality of female recesses in said other of said mating surfaces;

b) positioning said target and backing plate adjacent each other to form an assembly having an interface defined by said mating surfaces; and c) pressure consolidating said assembly under low temperature conditions of less than about 38° C. whereby that said male portions force fit into said female recesses to bondingly join said target and backing plate to each other.

2. Method as recited in claim 1 wherein said assembly includes a peripheral boundary surrounding said male projections and said female recesses and further comprising the additional step of (d) bonding said assembly proximate the peripheral boundary of said assembly.

3. Method as recited in claim 2 wherein said step (d) is performed after said step (b) and before said step (c).

4. Method as recited in claim 3 wherein said step (d) comprises e-beam welding of said assembly.

5. Method as recited in claim 4 wherein said step (d) further comprises interposing a weldable filler material between said target and said backing plate proximate said peripheral boundary.

6. Method as recited in claim 2 wherein said step (d) comprises friction welding.

7. Method as recited in claim 2 wherein said step (d) comprises TIG welding.

8. Method as recited in claim 6 wherein said target comprises Cu.

9. Method as recited in claim 2 wherein said step (d) comprises e-beam welding said target along an annular zone located adjacent said peripheral boundary.

10. Method as recited in claim 2 further comprising (e) low temperature annealing said pressure consolidated assembly.

11. Method as recited in claim 1 wherein said step (c) comprises pressure consolidating said assembly at about room temperature.

12. Method of bonding a sputter target to a backing plate member along a plane defined by mating interfacial surfaces of said target and backing plate, said method comprising:

a) forming a plurality of projecting male portions in one of said interfacial surfaces, and a plurality of female recesses in said other of said mating surfaces;

b) positioning said target and backing plate in a position ready for bonding with said interfacial surfaces adjacent each other; and c) pressure consolidating said target and backing plate at a temperature of less than about 38° C. and at a pressure sufficient to force fit said male projections into said female recesses to bondingly join said target and backing plate to each other.

13. Method as recited in claim 12 wherein said step (c) is conducted at about room temperature.

14. Method as recited in claim 13 wherein said target is Cu or Cu alloy.

15. Method as recited in claim 13 further comprising, prior to said step (c), a step (d) of bonding said target and backing plate member around a peripheral boundary portion of said mating interfacial surfaces.

16. Method as recited in claim 15 wherein said step (d) comprises interposing a weldable filler material between said target and said backing plate along said peripheral boundary portion.

17. Method as recited in claim 15 wherein step (d) comprises e-beam welding.

18. Target/Backing plate assembly made by any one of the preceding claims.

\* \* \* \* \*